US012650458B1

(12) United States Patent
Wilson et al.

(10) Patent No.: US 12,650,458 B1
(45) Date of Patent: Jun. 9, 2026

(54) WIDE BANDGAP SEMICONDUCTOR CHARACTERIZATION BASED ON CAPACITANCE CHARACTERISTICS ACQUIRED USING CORONA SURFACE CHARGE NEUTRALIZATION BY UV RADIATION PULSES

(71) Applicant: Onto Innovation SDI LLC, Tampa, FL (US)

(72) Inventors: Marshall D. Wilson, Tampa, FL (US); Jacek Lagowski, Tampa, FL (US); Ivan Shekerov, Tampa, FL (US); Bret Schrayer, Oldsmar, FL (US); Carlos Almeida, Odessa, FL (US); Liliana Gutierrez-Hernandez, Tampa, FL (US); Adam Wincukiewicz, Tampa, FL (US)

(73) Assignee: Onto Innovation SDI LLC, Tampa, FL (US)

( * ) Notice: Subject to any disclaimer, the term of this patent is extended or adjusted under 35 U.S.C. 154(b) by 0 days.

(21) Appl. No.: 19/206,003

(22) Filed: May 12, 2025

(51) Int. Cl.
*G01R 31/26* (2020.01)
*G01R 1/07* (2006.01)
*G01R 31/265* (2006.01)

(52) U.S. Cl.
CPC ......... *G01R 31/2648* (2013.01); *G01R 1/071* (2013.01); *G01R 31/2601* (2013.01); *G01R 31/2656* (2013.01)

(58) Field of Classification Search
CPC ............ G01R 31/2648; G01R 31/2601; G01R 31/2656
See application file for complete search history.

(56) References Cited

U.S. PATENT DOCUMENTS

| | | | | |
|---|---|---|---|---|
| 5,773,989 | A * | 6/1998 | Edelman | G01N 27/60 |
| | | | | 257/E21.531 |
| 10,969,370 | B2 * | 4/2021 | Lagowski | G01N 27/221 |
| 12,027,430 | B1 | 7/2024 | Wilson et al. | |
| 12,154,833 | B2 | 11/2024 | Wilson et al. | |

OTHER PUBLICATIONS

Burk et al., "Industrial Perspective of SiC Epitaxy," Wide Bandgap Semiconductors for Power Electronics: Materials, Devices, Applications, 2021, 1:75-92, 18 pages.
Pushkarev et al., "Optimizing Non-Contact Doping and Electrical Defect Metrology for Production of SiC Epitaxial Wafers," Solid State Phenomena, 2023, 342:99-104.

(Continued)

*Primary Examiner* — Dominic E Hawkins
(74) *Attorney, Agent, or Firm* — Paradice & Li LLP

(57) ABSTRACT

A method of characterizing a wide-bandgap semiconductor sample includes: depositing a corona charge on a surface of the sample; measuring a surface voltage at the region; irradiating the region with a series of ultraviolet (UV) radiation pulses to neutralize the deposited charge, wherein the increments of neutralized corona charge are linear with the pulse duration; measuring the surface voltage at the region after each UV radiation pulse and determining an average voltage in the pulse, and an incremental change of the surface voltage; and calculating a capacitance-voltage (C-V) characteristic for the region based on a series of capacitance values and surface voltage (V) values.

21 Claims, 12 Drawing Sheets

(56) References Cited

OTHER PUBLICATIONS

Schroder, "Chapter 9: Charge-based and Probe Characterization," Semiconductor Material and Device Characteristics, Wiley-Interscience, Hoboken, New Jersey, 2006, 523, 11 pages.

Shahin, "Characteristics of Corona Discharge and Their Application to Electrophotography," Photogr. Sci. Eng., 1971, 15(4):322, 7 pages.

Wilson et al., "High Throughput Wafer Characterization for Manufacturing Needs of SiC and Other WBG Technologies," Semilab SDI, 12415 Telecom Dr., Tampa, Florida 33637, USA, 2024, 4 pages.

Wilson et al., "Noncontact High Throughput, High Precision, Electrical Metrology for Wide Bandgap Semiconductors based on Corona Charge Photoneutralization Kinetics," Paper, ICSCRM 2023: International Conference on Silicon Carbide and Related Material, Sep. 18, 2023, 4 pages.

Wilson et al., "Novel Noncontact Enhanced Throughput Electrical Characterization for AlGaN/GaN HEMT Technology," Paper, 2024 IEEE 11th Workshop on Wide Bandgap Power Devices & Applications (WiPDA), Dayton, OH, USA, Nov. 4-6, 2024, 1-5.

Wilson et al., "Recent Advancement in Noncontact Wafer Level Electrical Characterization for WBG Technologies," Paper, ICSCRM 2024: International Conference on Silicon Carbide and Related Materials, Oct. 2, 2024, 7 pages.

Wilson et al., "Review—Recent Advancement in Charge- and Photo-Assisted Non Contact Electrical Characterization of SiC, GaN, and AlGaN/GaN HEMT," ECS Journal of Solid State Science and Technology, 2017, 6(11) S3129, 13 pages.

Wilson et al., "Noncontact Measurement of Doping with Enhanced Throughput and High Precision for Wide Bandgap Wafer Manufacturing," Paper, CSMANTECH 2023 proceedings, Orlando FL, May 15-18, 2023, 4 pages.

Wilson et al., "Novel Capacitance Measurement Technique for Noncontact Wafer Level Characterization of AlGaN/GaN HEMT Structures," Paper, CSMantech 2025 proceedings, Semilab USA LLC, 12415 Telecom Dr., Tampa, FL 33637, 2025, 2 pages.

Wilson, "Compound Semiconductor," Sep. 2019, 25(6):20-26.

* cited by examiner

FIG. 2A                    FIG. 2B

WIDE BANDGAP SEMICONDUCTOR CHARACTERIZATION BASED ON CAPACITANCE CHARACTERISTICS ACQUIRED USING CORONA SURFACE CHARGE NEUTRALIZATION BY UV RADIATION PULSES

TECHNICAL FIELD

This application generally relates to non-invasive electrical characterization of wide bandgap semiconductor materials and structures, and more particularly, to methods and systems for noncontact measurement of capacitance characteristics of epitaxial layers and of high electron mobility transistor structures.

BACKGROUND

Electrical characterization of semiconductor materials and structures is a necessary element for development of semiconductor devices and for optimizing and controlling the manufacturing process. Rapidly growing semiconductor applications for power electronics and high-speed devices, are based on high-cost wide bandgap wafers with epitaxial layers, such as, SiC, $Ga_2O_3$, GaN, AlGaN, or AlGaN/GaN structures. Mass epi-layer testing is needed to scale this progressing technology. A cost and time effective non-contact version of the wafer level electrical metrology can be especially beneficial for this purpose. Noncontact characterization can eliminate the need for fabrication of test devices, test capacitors, and the use of destructive or contaminating contacts.

An example of a non-contact capacitance measurement for wide bandgap semiconductor wafers is described in U.S. Pat. No. 10,969,370B2. Such measurements can be performed with commercially available Corona non-contact Capacitance Voltage (CnCV) tools manufactured by Semilab SDI. CnCV uses corona charging to electrically bias the surface of a semiconductor instead of the voltage biasing of a gate electrode contacting the semiconductor.

A non-contact determination of capacitance in CnCV method is realized with incremental deposition of precise corona charge doses $\Delta Q_C$ and non-contact Kelvin probe measurement of the surface voltage response, $\Delta V$. Differential capacitance values $C=\Delta Q_C/\Delta V$ in a series of corona charging-voltage measuring steps give a capacitance-voltage characteristic. Electrical parameters are then determined using the standard well known procedures developed for capacitance-voltage methods and described in literature. In the present disclosure, example applications include a determination of dopant concentration in SiC epi-layers and a determination of AlGaN/GaN structure parameters, such as, the pinch off voltage, the two-dimensional electron gas density, and the AlGaN layer thickness.

Rapidly growing power and high frequency electronics demands for SiC and AlGaN/GaN epi-wafers has created a special need for increasing the throughput in CnCV measurements. In standard CnCV, the multi-step incremental charge deposition and surface voltage measurement sequence provides limitations for the measurement speed and wafer throughput well below industry requirement of typical 20 wafers/h. A recent development of accelerated doping measurement described in U.S. Pat. No. 12,027, 430B1 and U.S. Pat. No. 12,154,833B2 introduced fast kinetic measurement based on exponential photoneutralization of corona deposited charge. This method available as the kinetic mode in modified CnCV tools introduces new determination of dopant concentration from a measured value of the photoneutralization time constant. However, it is limited to doping and does not improve the capacitance-voltage based measurements.

SUMMARY

The present disclosure relates to a noncontact, noninvasive characterization of the electrical properties of wide bandgap semiconductors and structures, suitable for high throughput. The C-V technique is based on a principle of linear corona charge neutralization producing rapid sequence of charge steps created suing short wavelength ultraviolet radiation pulses. This approach benefits throughput as well as resolution and precision.

The characterization is based on capacitance characteristics acquired by using a novel approach to change the corona charge on the surface in precise charge steps, $\Delta Q_C$, created by pulses of UV radiation under a condition wherein $\Delta Q_C$ is linear with the UV pulse duration, $\Delta t_p$. Measuring the surface voltage increments, $\Delta V$, corresponding to the charge steps gives the capacitance as $C=f_{cal}\Delta tp/\Delta V$ where $f_{cal}$ is the calibration constant.

The CnCV technique uses deposition of corona charge of an appropriate polarity to deplete the surface space charge region of free carriers. This is realized by placing negative charge on n-type semiconductors and positive charge on p-type semiconductors, respectively. In wide bandgap semiconductors the surface space charge region depleted of free carriers isolates the surface from the conducting bulk region. Due to the wide bandgap there is no thermal generation of excess carriers within the depletion region in the dark. This provides corona charge stability in the dark on bare epi-wafers enabling movement of the wafer between UV radiation neutralizing the charge and the probe measuring the surface voltage before and after charge neutralization.

Conventional CnCV employs static differential capacitance determined as $C=\Delta Q_C/\Delta V$. A measuring method described in U.S. Pat. No. 10,969,370B2 uses constant surface potential corona charging that involves adjustment of the surface potential at a region of a surface to the prescribed target value before each charging step in the entire sequence of measuring the capacitance-voltage characteristic. This consumes time and affects the measuring speed. The speed limitation in standard CnCV is also due to relatively slow corona charge deposition in the charging steps. The corona charging process involves high voltage application to a corona electrode that creates $CO_3^-$ and $H_3O^+$ ionic charge species for negative and positive corona, respectively. The ions move from the corona source by diffusion. The very short ion free path in atmospheric ambient (about $10^{-5}$ cm) causes that the ions retain very little energy and are thermalized before noninvasive deposition on the surface.

The corona charge deposition step can typically take about 0.5 seconds and as many as 200 steps can be used for high resolution C-V. Wafer testing uses C-V characteristics at 9 to 49 test sites on the wafers. Corresponding total charging time is an important throughput limitation.

The approach described here can enable a C-V measurement with short (e.g., 0.5 milliseconds to 10 milliseconds) duration charge pulses compared to 500 milliseconds in standard CnCV. This approach can give about two orders of magnitude reduction of time needed to create a sequence of charge steps used for C-V characteristics.

A principle of the C-V measurement described here is based, at least in part, on the finding that for sufficiently short UV radiation wavelength the magnitude of neutralized charge, $\Delta Q_C$, can depend linearly on the duration of the UV pulse. In measurement of SiC or GaN bare epi-layers, for example, this linear dependance can be satisfied when the UV penetration depth in a semiconductor is much smaller than the width of depleted surface space charge region. In measurement of AlGaN/GaN HEMT structures, the linear charge neutralization condition can be satisfied when incident UV photons are sufficiently absorbed within the top AlGaN barrier layer of the structure. In practice, UV wavelength equal to or shorter than about 250 nm can be sufficient in both cases. An example of an appropriate radiation source is a LED with a 235 nm wavelength.

The linear charge neutralization phenomenon enables the use of a UV pulse duration $\Delta t_p$, as an indicator of the charge increment value, $\Delta Q_C$ in relative units. This provides a way to determine the capacitance value in relative units as $C=const. \Delta t_p/\Delta V$, where $\Delta V$ is the change of surface voltage in response to the UV radiation pulse measured with the Kelvin probe as the difference in surface voltage value, I', after and before the UV pulse i.e. $\Delta V=V_{after}-V_{before}$. The capacitance value C in C-V corresponds to the average voltage $V=(V_{after}+V_{before})/2$. For capacitance quantification, the method can incorporate calibration of the UV pulse duration and the charge, $\Delta Q_C=f_{cal}\cdot\Delta t_p$, enabling conversion of the relative capacitance to capacitance in absolute units. The calibration factor $f_{cal}$ can be determined for a given semiconductor wafer for a specific UV radiation condition: the wavelength $\lambda$, and the effective photon flux, $\phi_{eff}$.

Based on the linear charge neutralization phenomenon, the charge increments $\Delta Q_C$ can be conveniently varied by changing the duration of the UV radiation pulses. This can benefit measurements optimizing measurement speed and resolution by adjusting the UV pulse duration to produce a variable charge increment C-V characteristics. Corresponding applications may include two frequently measured cases, such as: (1) measurement of epi-wafers with multiple layers of different dopant concentration values, and (2) characterization of AlGaN/GaN HEMT structures that typically include low and high capacitance segments corresponding to a depleted and populated 2DEG, respectively. The optimized variable increment C-V measurement is realized using different duration pulses of UV radiation in different C-V segments. Short pulses can be used for low doping/low capacitance segments, while longer pulses can be used for high doping/high capacitance segments.

An additional advantage of UV radiation pulsing over standard CnCV charge deposition steps relates to the fact that it can be used directly under the Kelvin probe. In this case, the movement of the Kelvin probe up by about 2 mm, for example, can facilitate uniform radiation during the UV pulse, while movement of the probe down to an optimal measurement distance, typically 0.2 mm above the wafer surface, can benefit the precision of the $\Delta V$ determination. The probe movement can be faster than the lateral wafer transfer needed in the case of UV radiation at separate locations. An implementation combining UV radiation under the probe with a variable increment C-V approach can be especially beneficial in characterization of AlGaN/GaN HEMT structures. For a typical nine wafer site measurement with determination of three HEMT parameters, namely, the pinch-off voltage, $V_P$, the density of two-dimensional electron gas, $N_{2DEG}$, and the AlGaN barrier layer thickness, the method can satisfy an industry requirement of throughput of 20 wafers/h compared to only 2 wafers/h throughput typical for characterization with the previous standard CnCV technique using sequential corona charge deposition.

The method described here is generally intended for electrical characterization of wide bandgap semiconductors, such as, for instance, SiC, GaN, AlGaN, $Ga_2O_3$ and wide bandgap structures such as an AlGaN/GaN HEMT structure. The method is noncontact and can be performed without fabrication of any test devices or contacts on the test wafer. It can be implemented with appropriately modified hardware for CnCV tools.

A system for characterizing semiconductor electrical properties according to the described method can be implemented in a modified version of a CnCV apparatus that includes:

(1) a surface voltage measurement probe;

(2) a corona charging source for depositing a prescribed dose of negative or positive charge on the surface to deplete the wide bandgap semiconductor wafer surface space charge region;

(3) a pulsed UV radiation source at the border of the far ultraviolet spectral range such as, for instance, 235 nm wavelength appropriate for linear corona charge neutralization and creation of incremental neutralized charge pulses on wide bandgap semiconductor surfaces, as well as on the surface of AlGaN/GaN HEMT structures. The UV radiation source is configured to neutralize charge at the region positioned directly under the surface measurement probe, or at a separate position;

(4) a moveable chuck configured to support the semiconductor wafer/sample relative to the surface voltage probe, the corona charge source, and the UV radiation source; and (5) a computer controller in communication with the elements of the apparatus and programmed to cause the system to perform measurements of C-V and to carry out determination of the electrical parameters of wide bandgap semiconductor materials and structures.

Other features and advantages will be apparent from the drawings, description, and the claims.

BRIEF DESCRIPTION OF DRAWINGS

In the drawings, like references denote like elements.

DETAILED DESCRIPTION

Figure 1:
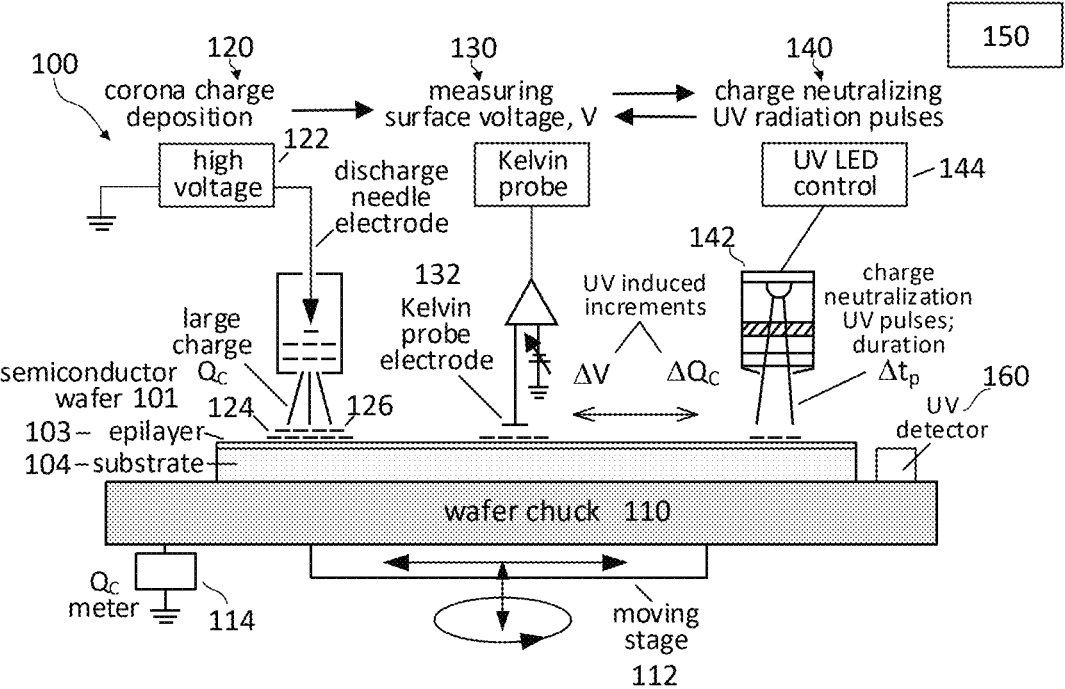
FIG. 1 is a schematic diagram of an example CnCV apparatus for wide band gap (WBG) semiconductor characterization.

Referring to FIG. 1, an example apparatus 100 for corona charge-voltage characterization of a semiconductor wafer sample 101 is shown schematically. The wafer sample includes a substrate 104 and an epitaxial layer 103 supported by the substrate 104. The apparatus 100 includes a corona charge source module 120 for precise charge 124 deposition on a surface region test site 126, a surface voltage measurement module 130 for surface voltage measurement, ultraviolet radiation source module 140 for irradiating the wafer surface to neutralize deposited charge.

Wafer 101 is supported by a wafer chuck 110, which is positioned on a movable stage 112. Stage 112 can move the wafer chuck by translation, vertical movement, and rotation. A coulombmeter 114 is electrically connected to the wafer chuck 110.

The corona charge source module includes a corona charge electrode arranged to deposit corona charge 124 on a site 126 on the surface of wafer 101. Surface voltage measurement module 130 includes a Kelvin probe that has an electrode 132 arranged to vibrate a small distance (e.g., a millimeter or less) above the surface of wafer 101. While the example described here uses a Kelvin probe, other capacitance probes can be used.

UV radiation source module 140 includes a radiation source 142 arranged to irradiate the surface of the wafer 101 at a region 126 with prescribed radiation pulses. During operation, UV source 142 delivers pulses having a short wavelength suitable for linear neutralization of deposited corona charge in steps $\Delta Q_C$ of neutralized charge proportional to the UV pulse duration, $\Delta t_p$ and to the UV photon flux $\Phi$. The photon flux can be measured using UV detection 160, preferably with NIST calibration. UV source 142 can include a UV emitting diode (UV LED) or a near UV laser, for example. For a UV LED, the beam can be additionally monochromatized by passing through a narrow band pass filter. A diffuser can be added after the filter to improve the uniformity of the radiation.

UV radiation can be arranged to provide uniform radiation on the surface area of the corona charged spot, e.g. circular area spot about 10 mm or less in diameter (e.g. about 6 mm diameter).

Figure 2:
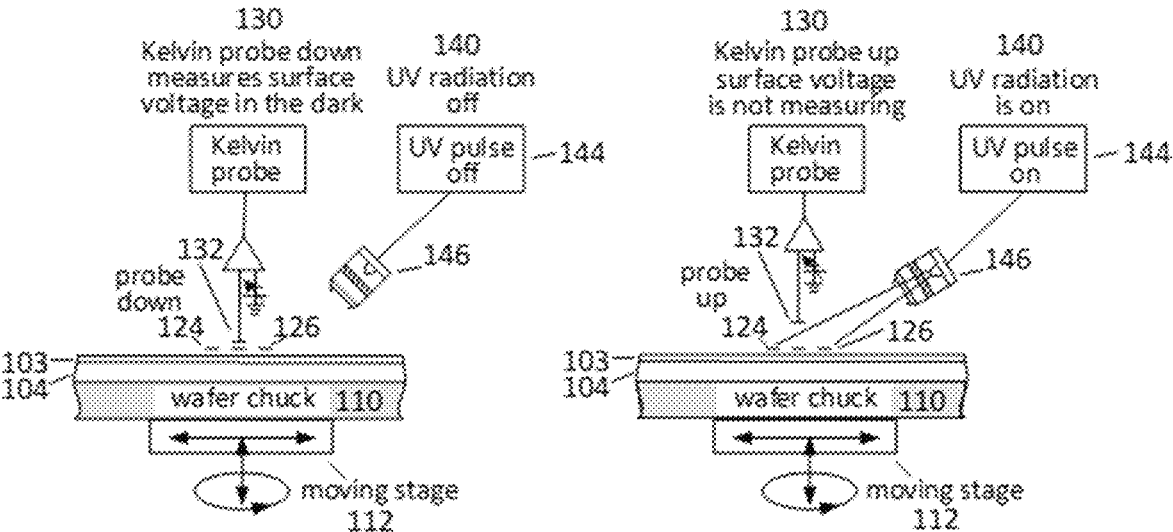
FIGS. 2A and 2B are schematic diagrams of a portion of the CnCV apparatus shown in FIG. 1 arranged for corona charge neutralization by UV radiation under a Kelvin probe.

The example apparatus 100 shown in FIG. 1 illustrates one configuration of the UV radiation source 142 for irradiation separate from the Kelvin probe 132. However, other configurations are also possible, including UV radiation under the Kelvin probe, as illustrated in FIG. 2A, using the UV radiation source 146. Standard high precision Kelvin probes can use gold electrodes that are nontransparent. In cases where the Kelvin probe electrode 132 is nontransparent, a low angle radiation from the side can be used as schematically shown in FIG. 2 for UV source 146. In this case, the Kelvin probe 132 can be positioned further up above the wafer surface for uniform radiation, as shown in FIG. 2B. For precise surface voltage measurement, the Kelvin probe 132 can be in a down position as shown in FIG. 2A. The probe down position, with an electrode vibrating about a fraction of mm above the measured surface can be used for surface voltage measurement performed in the dark, before and after UV radiation pulses. The probe positioning can be done, for example, by vertical repositioning of the wafer with respect to Kelvin probe electrode 132. Repositioning can be done using the computer controlled moving stage 112 in FIG. 1, and in FIGS. 2A and 2B.

In some implementations, a transparent Kelvin probe with UV radiation through the electrode can also be used. In general, high uniformity of UV radiation may be easier to achieve in case of separate UV radiation with the source 142 shown in FIG. 1.

Wide band gap (WBG) semiconductor characterization, can be performed using system 100, with a pulsed deep ultra-violet radiation source 142 and radiation control module 140. A 235 nm wavelength (i.e., 5.3 eV photon energy) UV LED can be effectively used for WBG semiconductors, such as SiC, GaN, AlGaN and the AlGaN/GaN HEMT structure. The range of incident photon flux, $\Phi$, in UV radiation pulses can be in a range from ($10^{12}$ to $10^{14}$) incident photons per cm²s. Near surface excitation of the electron-hole pairs is a necessary condition to create a strictly linear UV induced corona charge neutralization effect illustrated in FIG. 3. In the linear neutralization effect the UV radiation pulses neutralize deposited corona charge in incremental steps with a magnitude $\Delta Q_C$ being a linear function of the pulse duration, $\Delta t_p$, and the incident photon flux, $\Phi$. In the linear relationship $\Delta Q_C = f_{cal} \cdot \Delta t_p$, the $f_{cal}$ is the calibration constant that is proportional to the incident photon flux, Pin the radiation pulses. The LED radiation source 142 in FIGS. 1 and 146 in FIG. 2A-B, respectively, can incorporate a narrow band pass filter to eliminate longer wavelength radiation which causes distortion to the linear neutralization effect. The long wavelength radiation, for example, with wavelengths $\lambda$=325 nm or $\lambda$=355 nm if present, would produce interference from a different nonlinear effect, such as the exponential photoneutralization dependence on the illumination time employed in U.S. Pat. No. 12,027,430B1 and U.S. Pat. No. 12,154,833B2 for a different doping measurement principle, based on photoneutralization time constant of an exponential effect. To eliminate other interfering effects of stray light, system 100 is placed in a container to block out stray light and stray UV radiation.

Using the linear neutralization UV radiation effect, the UV pulsed signal power supply control in module 140 shall produce accurate pulses with precisely controlled pulse duration and magnitude of UV photon flux. For pulses with a typical duration range $\Delta t_p$, from 1 ms to 20 ms, a pulse duration precision of $\pm 2$ us is recommended. This is achieved using precise pulse triggering control by module 140. This together with UV LED power supply current magnitude control with 0.01% precision in module 140 enables production of precise corona charge neutralization steps as needed for high precision capacitance determination for characterization of WBG semiconductor wafers and structures.

For noncontact surface voltage measurement, an accurate and fast-responding Kelvin probe is preferred, such as a probe with a time constant of about 3 ms to 5 ms with 0.2 mV precision. A surface voltage measuring range from −100 V to +100 V is typical for corona charge biasing to deep depletion for n-type (negative bias) and p-type (positive bias) semiconductors. An electrode diameter of 1 mm to 2 mm, for example, is suitable for measuring surface voltages in the uniform center region of the corona charged and illuminated area.

Corona charging is realized using a corona discharge in air produced by a high DC voltage applied from power supply 122 to discharge electrode 128. The negative polarity discharge in air produces $CO_3^-$ ions, while the positive polarity discharge produces $(H_2O)_nH^+$ ions. The corona discharge electrodes (a needle for point charging or a wire for whole wafer charging) can be confined in an enclosure and the ion deposition is not field driven; instead, ions diffuse to the wafer surface through an aperture opening. Considering the very short mean free path of $10^{-5}$ cm at room atmosphere, the ions lose kinetic energy and become thermalized before reaching the semiconductor surface. Such a configuration enables noninvasive corona charge biasing. Precise corona charging is typically performed in a cleanroom environment with controlled humidity and temperature. Control of the deposited corona charge density is realized by setting the corona power supply 122 high voltage, the discharge current, the deposition time period and the distance between corona source and the wafer. The deposition time period can be about 1 second or less, such as 0.5 second. The deposited charge density dose, $Q_C$, is precisely calibrated and it can be in-situ monitored with the coulombmeter 114.

For the present application, the range of corona charging magnitude extends from about $2\times10^{12}$ q/cm$^2$ up to about $1\times10^{13}$ q/cm$^2$ and the charging can be realized in a single charging step. The charge deposited on the surface at test site 126 is mirrored as opposite charge in the semiconductor surface space charge region and acts as an electrical bias. The charging dose is much larger than the initial present surface charge, typically about $1\times10^{11}$ q/cm$^2$. Thus, depending on the doping concentration, $N_D$, the charging dose, $Q_C$, can be selected to obtain a desired width of depletion $W_D = |Q_C/qN_D|$.

Wide bandgap semiconductor devices are fabricated mostly on n-type epitaxial layers and 4H-SiC is a commonly used material. Accordingly, illustrating example results of the method are presented here for n-type 4H-SiC and negative polarity corona charging. For measuring such wafers, the method can further include stabilizing fresh epitaxial 4H-SiC wafers using a UV pretreatment chamber, that can be part of apparatus 100. Immediately after the epitaxial growth process, 4H-SiC may exhibit rapid dissipation of deposited corona charge. This is caused by surface spreading of corona deposited ions or by dark neutralization of corona ions caused by electron transfer from ions to the semiconductor. If present, this effect can interfere with measurements of the UV induced charge neutralization.

Pretreatment eliminating such effects can be performed concurrently with the doping measurement on sets of multiple wafers. Such a capability can be added to an automated version of apparatus 100.

Stabilized bare surfaces of SiC in depletion typically exhibit good stability of corona charge in the dark. The large energy gap prevents thermal generation of free minority carriers that could neutralize corona charge. In the method, the charge stability in the dark after charging is verified by corresponding stability of the surface voltage. For that purpose, the method can include a prescribed period of surface voltage measurement in the dark after charging, and also after UV radiation pulses. A large dark surface voltage decay rate and a lower than nominally expected surface voltage magnitude for the deposited charge density, can be indicative of defects causing charge neutralization or dissipation and thus interfering with corona charge UV neutralization-based measurement. In such a case, the measurement can be repeated on a neighboring wafer site free of defects and with a negligible dark decay rate. In epitaxial 4H-SiC, used as an example in this disclosure, the interfering defects are device-killing triangular defects, downfall defects, or carrot defects. These defects can have submillimeter dimensions and shifting the measurement location by a distance greater than the diameter of the Kelvin probe, e.g., 3 mm to 5 mm in the case of a 2 mm diameter Kelvin probe, can be sufficient to eliminate interference.

Generally, measurements are performed under conditions when the corona charge is stable in the dark. For optimized measurement conditions, the magnitude of dark surface voltage decay, indicative of interfering effects, should be, i.e. insignificant compared to UV induced corona charge neutralization effect magnitude, e.g., in the range of about 0.01% or less.

Figure 3:
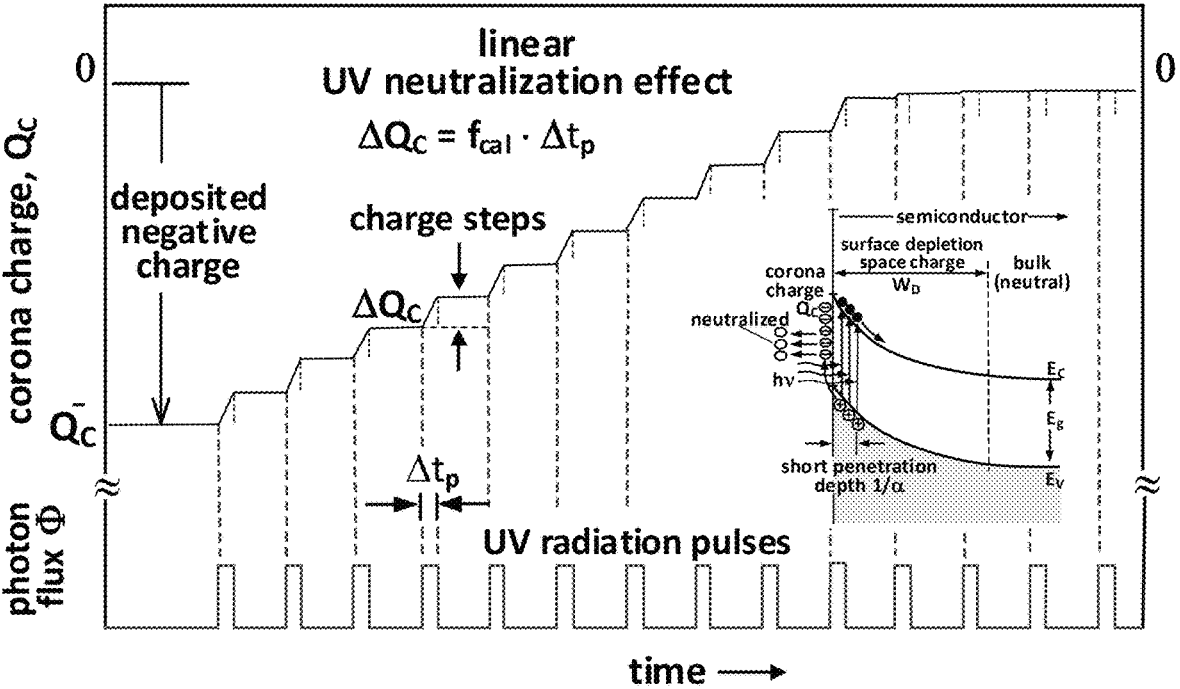
FIG. 3 is a plot of corona charge as a function of time showing neutralization sequential steps created by UV radiation pulses. The insert shows a semiconductor energy band diagram illustrating the mechanism of corona charge neutralization by UV generated free holes.

The sequence illustrating the method and shown in FIG. 3 represents the case of linear corona charge neutralization by UV radiation pulses as used for measurement of epitaxial layers of WBG semiconductors such as n-type SiC, GaN or AlGaN.

The sequence starts with depositing negative corona charge $Q_C$ that creates the surface depletion layer with the width, $W_D$ at a region of the wafer surface. After charge deposition the surface voltage is measured in the dark confirming stable charge, and the region is irradiated with short wavelength UV radiation pulses. To create the linear UV charge neutralization effect, the UV radiation shall have short penetration depth much shorter than $W_D$ such as for instance, the penetration depth of 0.1 μm for measuring the surface depletion range with thickness $W_D$ of 0.5 μm and larger. As illustrated in FIG. 3, the short UV radiation pulses create, under such conditions, the incremental charge steps, $\Delta Q_C$, of the neutralized corona charge wherein the step increment, $\Delta Q_C$, is a linear function of the duration, $\Delta t_p$, of UV radiation pulses in a series of pulses with a constant effective incident UV photon flux, $\Phi$.

The insert in FIG. 3 illustrates the mechanism of the linear corona charge UV neutralization. In this process UV photons hv are absorbed within a short penetration depth region beneath the surface much shorter than $W_D$. The absorbed UV photons, such as hv=5.3 eV photons in radiation from an appropriate short wavelength UV LED source, such as for example, a 235 nm wavelength UV LED, generate electron-hole pairs in a close to surface part of the total depletion space charge layer. The pairs are separated by a strong electric field. The positive holes are directed to the surface and neutralize the negative corona charge ions. The negative electrons are directed to the electrically neutral semiconductor bulk. As a result, the surface depletion barrier decreases and corresponding increments of the surface voltage, ΔV, can be measured with a Kelvin probe.

The corona charge incremental steps, $\Delta Q_C$ are constant in magnitude until the last stages leading to complete a total neutralization of the deposited corona charge. The linear relationship between $\Delta Q_C$ and the pulse duration $\Delta t_p$, continues in this sequence as long as the surface density of corona ions remains larger than the number of incident photons in the UV radiation pulse.

The linear neutralization effect for each pulse can be described as $\Delta Q_C = \eta \Phi \Delta t_p$, where η is the quantum efficiency, Φ is the incident photon flux of UV radiation, and $\Delta t_p$ is the pulse duration. For the radiation source with a 235 nm wavelength the efficiency η can be very high, such as, for example, η=0.7 that would correspond to 0.7 neutralized corona ions per incident photon. This high efficiency enables the use of UV radiation with a low photon flux Φ in the range between $10^{12}$ and $10^{14}$ photons/cm²s and very short radiation pulses with a duration $\Delta t_p$ that can be typically between 1 ms and 20 ms, and even shorter, such as the fraction of millisecond pulses. Short pulses are useful for performing measurements substantially faster than that in standard corona noncontact C-V measurements using sequential corona charge deposition steps.

The sequence of measurements corresponding to the illustration in FIG. 3 includes measurements not shown in this figure, such as measurements of the surface voltage values before and after each radiation pulse. The incremental change of the surface voltage ΔV represents the experimental variable analogous to the incremental change of the applied voltage in contact C-V techniques, such as, the mercury probe method MCV. However, in the present case, this is performed without any contact. Also similar to contact C-V, the relation between experimental variables in the present method are described by the well-known Schottky depletion layer electrostatic relationships. The specific relationships used for example, for determining doping concentration, $N_D$, in n-type semiconductor depletion layer include the following:

a) definition of the derivative capacitance, C:

$$C = \frac{\Delta Q_C}{\Delta V}$$

where $\Delta Q_C$ is the incremental change of the corona charge induced by the UV radiation pulse and ΔV is the UV induced change of the surface voltage.

b) capacitance relations to the width of the depletion layer, $W_D$. The latter being used as depth indicator in a dopant depth profiling:

$$C = \frac{\varepsilon_S}{W_D}$$

where $\varepsilon_S$ is permittivity of semiconductor.

c) $1/C^2$ vs V relationship used for dopant concentration determination from the inverse of the slope:

$$1/C^2 = \frac{2}{q \varepsilon_S N_D}(-V + V_{in})$$

$V_{in}$ is the initial surface voltage value without any corona charging.

d) Inverse slope of $1/C^2$ vs V plot is used for doping determination as:

$$N_D = \frac{2}{q \varepsilon_S} \cdot \left( \frac{d(1/C^2)}{dV} \right)^{-1}$$

e) doping depth profile is obtained as $N_D$ VS $W_D$.

For monitoring the within wafer uniformity of electrical parameters the measurements of parameters in relative units can be performed without calibration. For such measurements, the calibration constant $f_{cal}$ can be taken as 1, giving the capacitance values in relative units as $C_{rel} = \Delta t_p / \Delta V$. For determination of doping values in relative units the slope of $(\Delta V / \Delta t_p)^2$ vs. V can be used. In corresponding doping depth profiling, the depth value is also in relative units and it is given by the relative depletion width $$W_D = \frac{\varepsilon_S}{C_{rel}}.$$

The relative values measured with a constant UV radiation photon flux, Φ, can be converted to absolute values using the actual $f_{cal}$ value corresponding to the actual photon flux value.

According to the method in this disclosure, the determination of $f_{cal}$ can be performed using one of three example calibration procedures. A charge-based calibration procedure employs deposition of corona charge with precise in-situ monitored and prescribed calibration dose, $Q_{cal}$, increasing the surface depletion voltage from value $V_1$ to value $V_2$, measured with the Kelvin probe before and after charging. As a next step, the charged region is irradiated by UV radiation pulses with a prescribed photon flux, Φ, and prescribed pulse duration, $\Delta t_p$. The surface voltage, V, is monitored after each pulse and a calibration plot is constructed of V vs the net UV radiation time, $t_p = \Sigma \Delta t_p$. From this plot the radiation time interval $t_{pcal}$ corresponding to surface voltage change from $V_2$ back to $V_1$ is determined. This $t_{pcal}$ value corresponds to UV neutralization of the charge calibration, dose $Q_{cal}$. For the linear UV neutralization condition the calibration constant is obtained as $f_{cal} = Q_{cal}/t_{pcal}$.

The other calibration procedure is based on a comparison of the values of capacitance. It uses the calibration reference values of capacitance in absolute units, $C_{cal}$ vs voltage determined with the established CnCV technique at the same region on the wafer surface as the relative unit capacitance-voltage measured as $C_{rel} = \Delta t_p / \Delta V$. The calibration factor is determined as the ratio between values of $C_{cal}$ and $C_{rel}$ taken at the same values of the surface voltage $$V, f_{cal} = \frac{C_{cal}}{C_{rel}}.$$

The other example of the calibration procedure that can be incorporated in the sequence of doping concentration measurement uses comparison of the doping measuring slopes of $1/C^2$ vs V in the CnCV technique and of the $(\Delta V / \Delta t_p)^2$ vs V in the method of present disclosure. For calibration the uniform depth profile segment can be used. Calibration and relative slopes shall be taken at the same wafer region. The square of the calibration constant $f_{cal}^2$ in this approach can be determined using the ratio of the slopes in two measurements that reflect the ratio between corresponding doping concentrations in relative and absolute units.

In practice, in linear UV neutralization conditions, the $f_{cal}$ for flux value $\Phi_1$ can be easily converted to different UV flux, $\Phi_2$ as $$f_{cal2} = f_{cal1} \cdot \frac{\phi_2}{\phi_1}.$$

Figure 4:
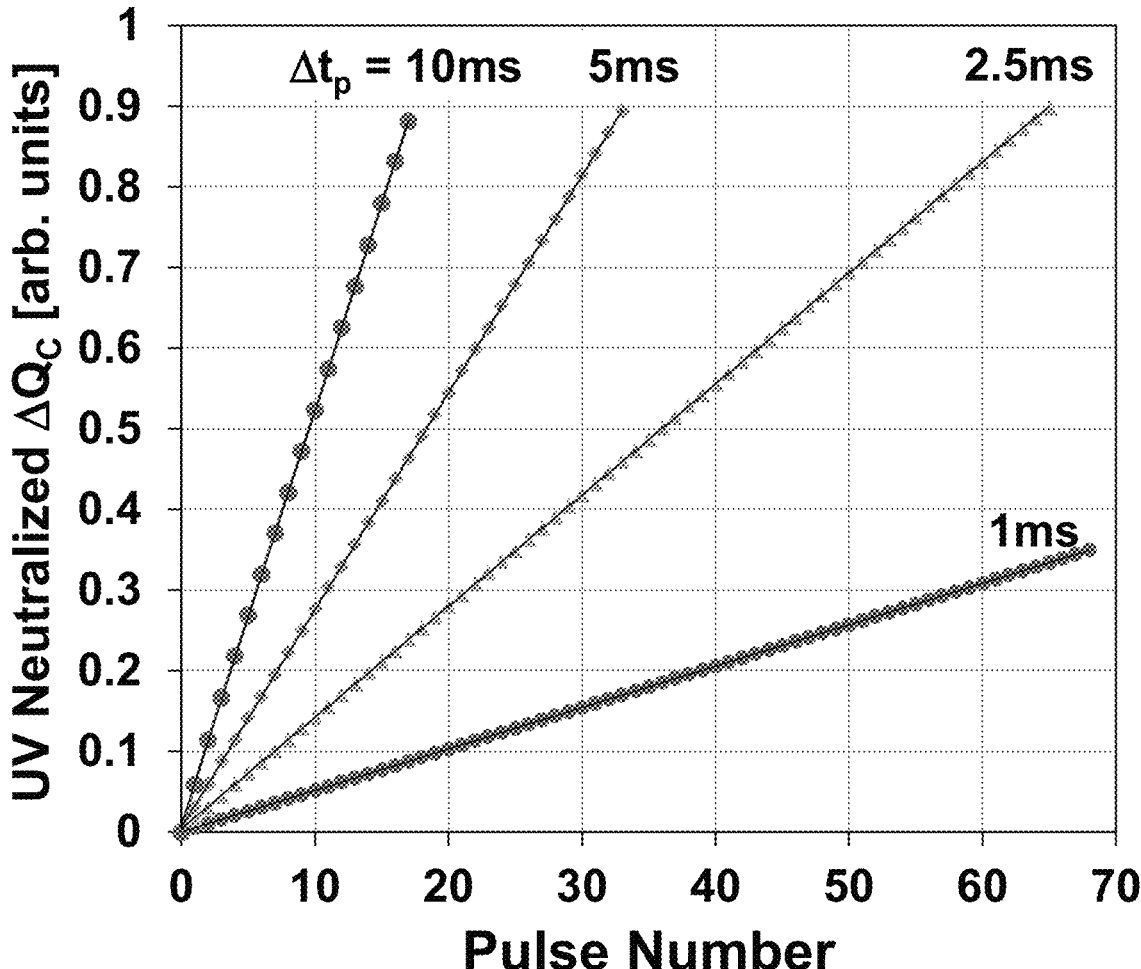
FIG. 4 is a plot of UV neutralized charge as a function of pulse number showing sequential corona charge linear neutralization by UV radiation with different duration $\Delta t_p$ at a constant photon flux $\Phi_{eff}$.

The linear neutralization of corona deposited surface charge by appropriate short penetration depth, UV radiation pulses was originally observed on negatively charged n-type 4H-SiC and was confirmed on other wide bandgap semiconductors such as, GaN and AlGaN including AlGaN/GaN HEMT structures. The application for noncontact semiconductor characterization benefits from two linear dependencies in the UV neutralization process that are demonstrated in FIG. 4 and FIG. 5. The experimental results correspond to n-type 4H SiC epitaxial wafers charged to depletion with a negative corona. The results in FIG. 4 show the effect of 235 nm wavelength UV radiation pulse duration $\Delta t_p$. The corona charge neutralized by the UV pulses increases linearly with the number of pulses in each series of pulses. The results demonstrate that the rate of charge neutralization is directly proportional to the pulse duration $\Delta t_p$, as is evident from increasing of the slopes of lines in accord with increasing of $\Delta t_p$ values from the shortest 1 ms pulses to the longest 10 ms pulses. A constant UV photon flux of $2.53 \times 10^{13}$ photons/$cm^2 s$ was used in these results. The results indicate very high efficiency, $\eta = 0.727$, of UV neutralization of the charge. Considering radiation loss of about 20% due to reflection, the quantum efficiency of the process is over 90%.

Figure 5:
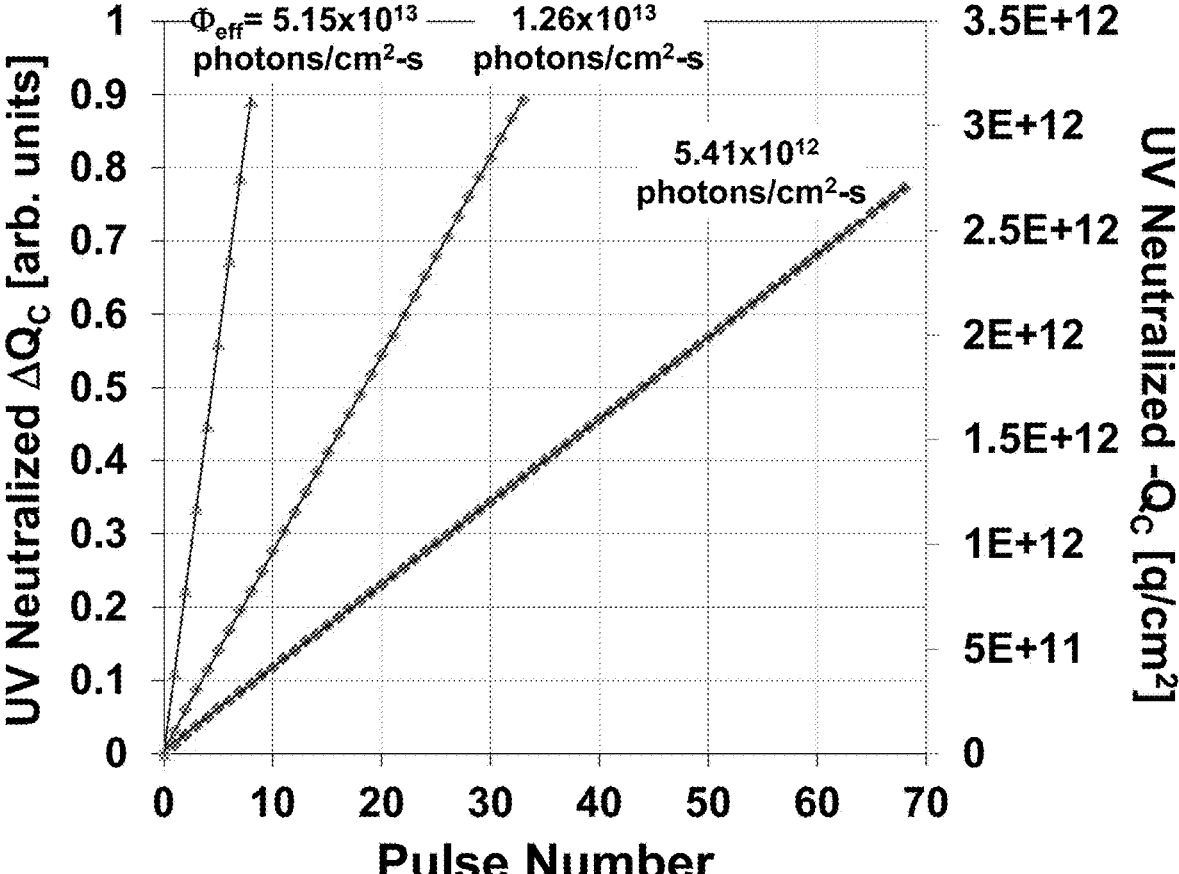
FIG. 5 is a plot of UV neutralized charge as a function of pulse number showing sequential corona charge linear neutralization by UV radiation pulses with constant duration $\Delta t_p=10$ ms with different photon flux values.

The results in FIG. 5 correspond to a constant $\Delta t_p = 10$ ms duration of UV radiation pulses and variable incident photon flux, $\Phi_{eff}$. These results demonstrate linear dependence of the charge neutralization rate on the incident photon flux, $\Phi$, in a range from $5.41 \times 10^{12}$ to $5.15 \times 10^{13}$ photons/$cm^2 s$.

The quantitative results, such as those in FIG. 4 and FIG. 5 can guide practical implementation of the linear neutralization effect in noncontact corona charge C-V metrology. Based on such results, a relation between the incremental charge changes, $\Delta Q_C$, in a step induced by the UV radiation pulse with incident photon flux, $\Phi$, and the pulse duration, $\Delta t_p$, is $\Delta Q_C = \eta \Phi \cdot \Delta t_p$. In practice, this relation can be verified using a calibration introduced in the present application. The calibration introduced a constant $f_{cal}$ relating the neutralized charge increment $\Delta Q_C$ to the pulse duration $\Delta t_p$ for a specific UV radiation photon flux, $\Phi$, as $\Delta Q_C = f_{cal} \cdot \Delta t_p$.

Figure 6:
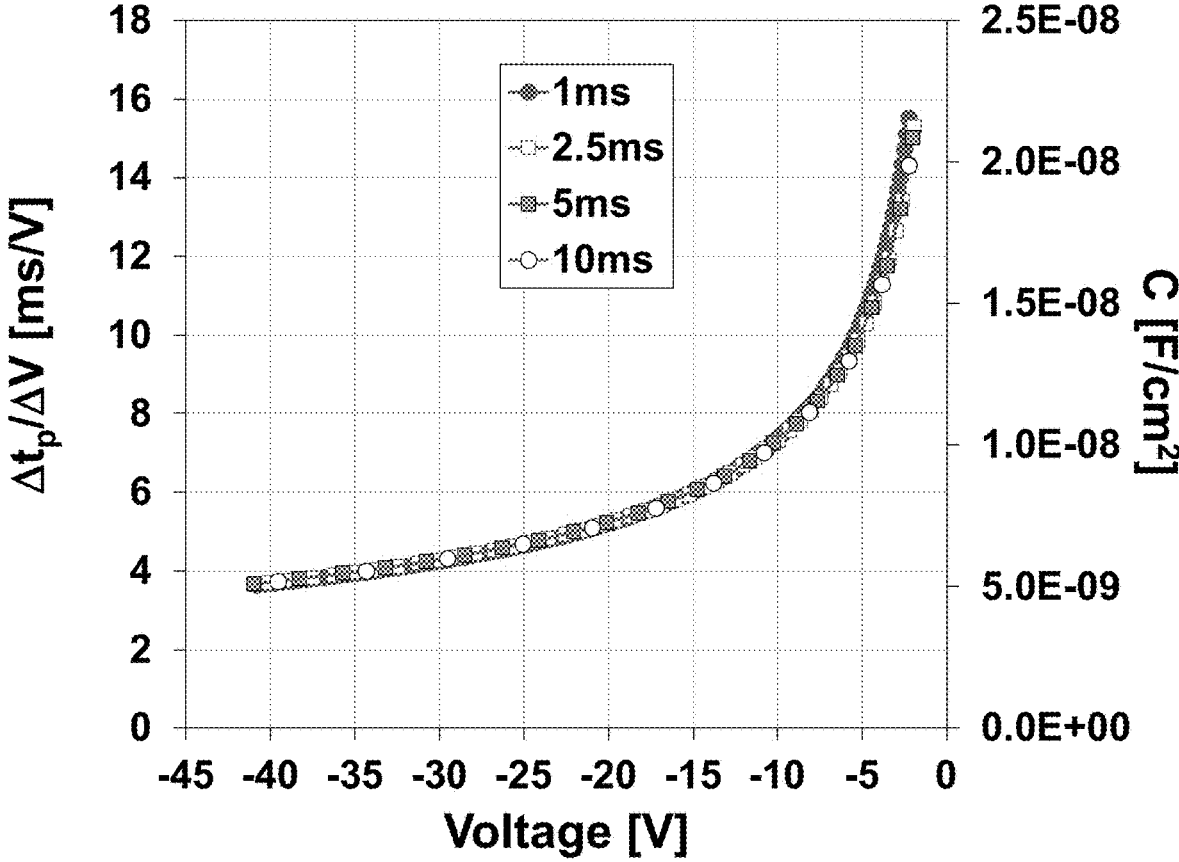
FIG. 6 is a plot illustrating C-V characteristics measured according to the described method.

The novel method according to the present application calculates the capacitance-voltage characteristic based on the ratio $\Delta t_p/\Delta V$. Such a characteristic is shown in FIG. 6 for n-type SiC. In this case, the measured SiC wafer region was charged with corona to deep depletion in the dark. The corresponding surface voltage, V, after charging is −42V and it changes toward the initial near zero value in a series of UV radiation pulses neutralizing the deposited charge. As a precision illustration the entire measurement sequence was repeated using different durations $\Delta t_p$ of UV radiation pulses. Consistently similar results are produced for different $\Delta t_p$. The scale on the left in FIG. 6 represents the capacitance in relative units, $C_{rel} = \Delta t_p/\Delta V$, while the scale on the right represent capacitance in absolute units obtained as $C = f_{cal} C_{rel}$. The calibration constant $f_{cal} = 1.47 \times 10^{-9}$ C/ms-$cm^2$ was determined using the charge-based calibration procedure described elsewhere in the application.

Figure 7:
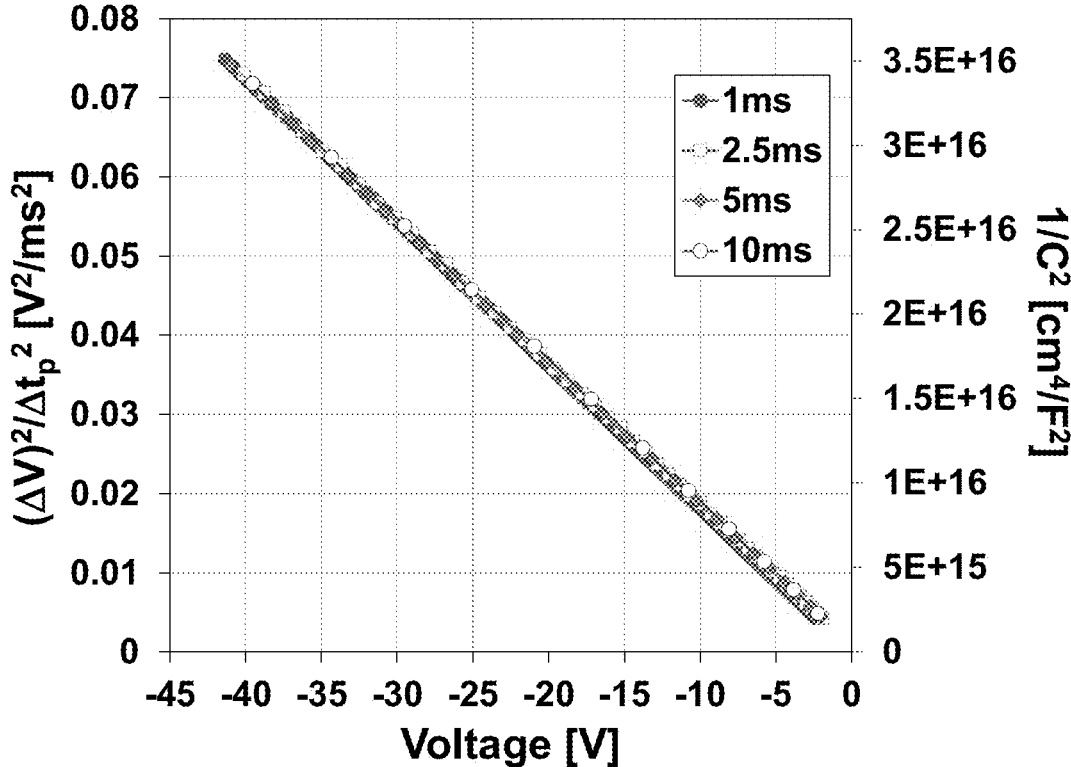
FIG. 7 is a plot illustrating the application of a linear corona charge UV neutralization method to doping characterization in SiC, n-type wafer showing $1/C^2$ vs V plot with the slope giving the dopant concentration $N_D$.
Figure 8:
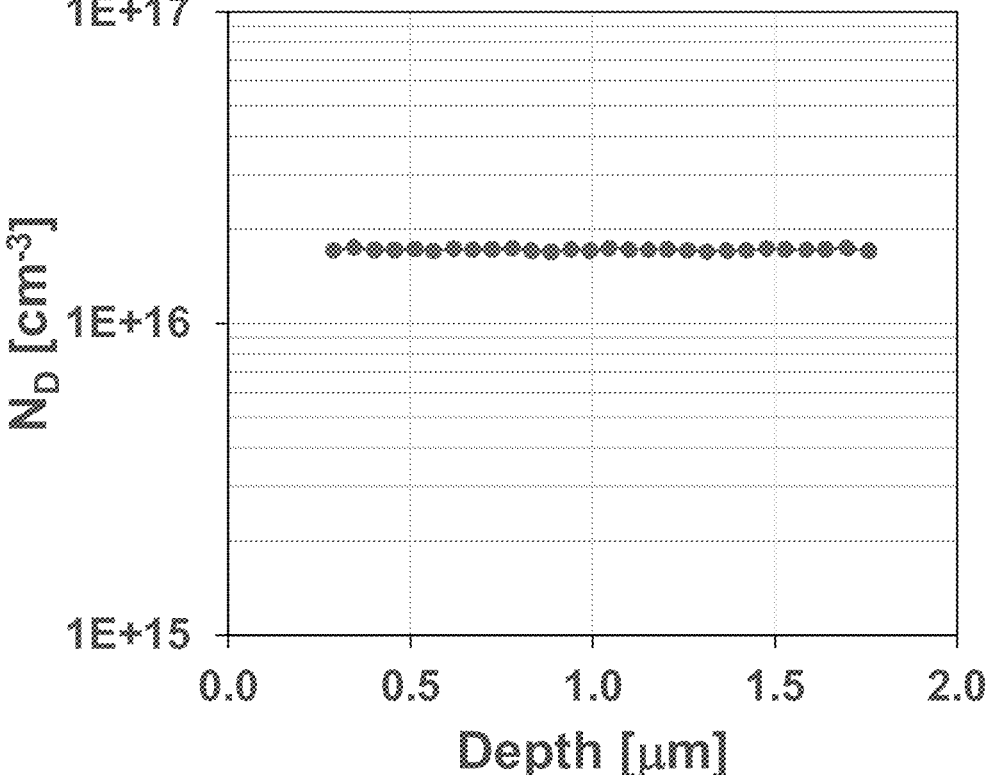
FIG. 8 is a plot corresponding to the example measurement illustrated in FIG. 7 showing a dopant depth profile.

Further application of the present C-V method for determination of doping concentration and doping depth profiling is illustrated in FIG. 7 and FIG. 8, respectively. In FIG. 7 the $1/C^2$ vs. V plot is obtained from the relative unit plot $(\Delta V)^2/(\Delta t_p)^2$ vs V. Doping concentration is determined from the inverse slope of plot in FIG. 7. The doping in this epi wafer is uniform in depth, as seen in FIG. 8. The profile is obtained using the inverse $1/c^2$ vs V slope values corresponding to different voltages. The voltage values, V, are converted to depth using the corresponding capacitance values C(V) from FIG. 6. The capacitance provides a measure of depth is equal to the width of depletion layer $W_D(V) = \varepsilon_S/C(V)$. This procedure follows commonly used standard capacitance-voltage doping depth profiling.

Figure 9:
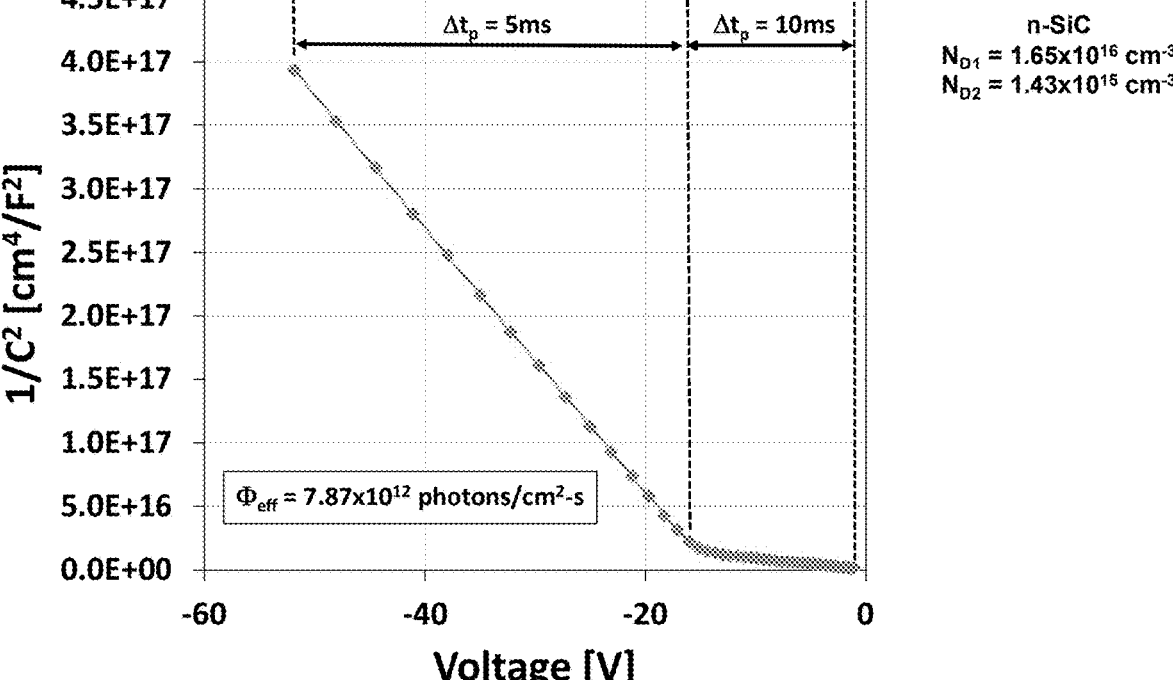
FIG. 9 is a plot showing application results for a SiC epi-wafer with two different doping layers obtained with a linear corona charge UV neutralization method. Different slopes of the $1/C^2$ plot correspond to differently doped layers measured with different UV pulse durations. Shorter 5 ms duration pulses are used for lower doping, while longer 10 ms duration pulses are for higher doping. The same photon flux was used for both pulse durations.
Figure 10:
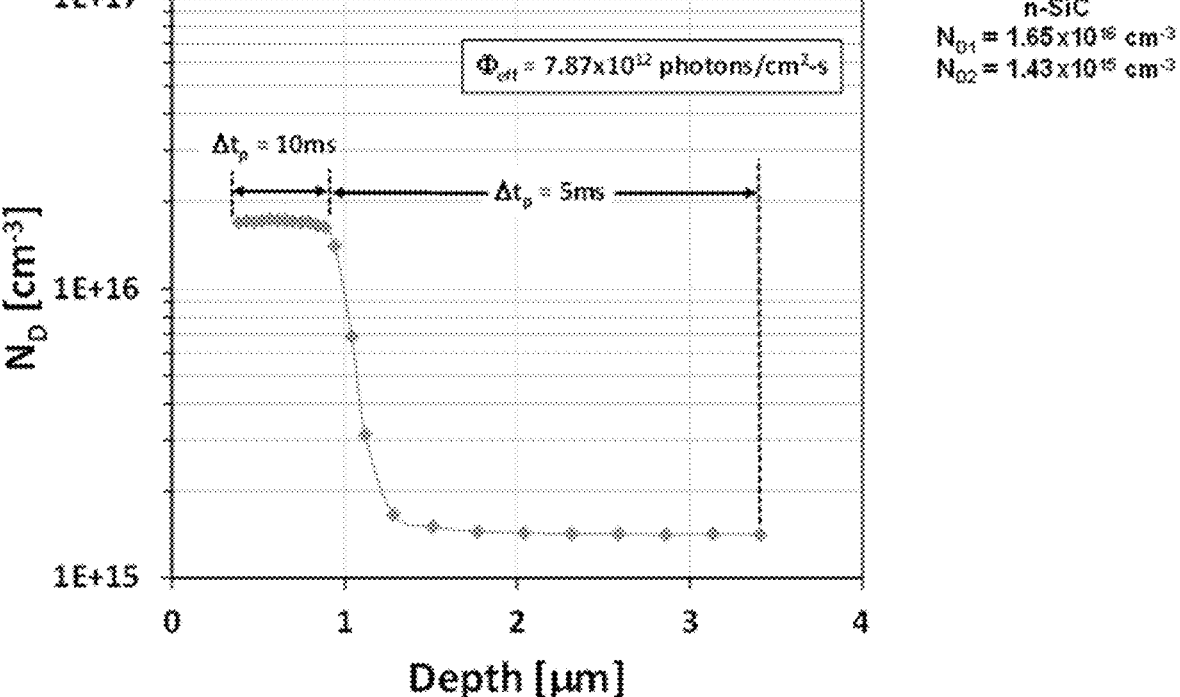
FIG. 10 is a plot showing results measured using the described method showing a doping depth profile in an epi-wafer with two differently doped layers. Results correspond to the $1/C^2$ plot in FIG. 9.

Illustration of the application of the present C-V measurement for doping characterization in a n-SiC wafer with two epi-layers is illustrated in FIG. 9 and FIG. 10. FIG. 9 shows the $1/C^2$ vs. V plot while the corresponding doping depth profile is shown in FIG. 10.

The results in FIG. 9 were obtained using a variable UV pulse duration measurement. In this approach shorter duration pulses, $\Delta t_p$, for 5 ms are used for measuring the lower doped epi-layer $N_{D2}$ located deeper in the wafer, while longer pulses, $\Delta t_p = 10$ ms are used for the higher doped layer $N_{D1}$ located near the wafer surface. The corresponding doping concentration profile $N_D$ vs depth is shown in FIG. 10.

Different duration UV pulse measurements, according to the present application can be performed using one and the same calibration constant, $f_{cal}$ for entire range covering both layers. This technique enables the optimization of measurements regarding the measurement speed and depth resolution in profiling.

Figure 11:
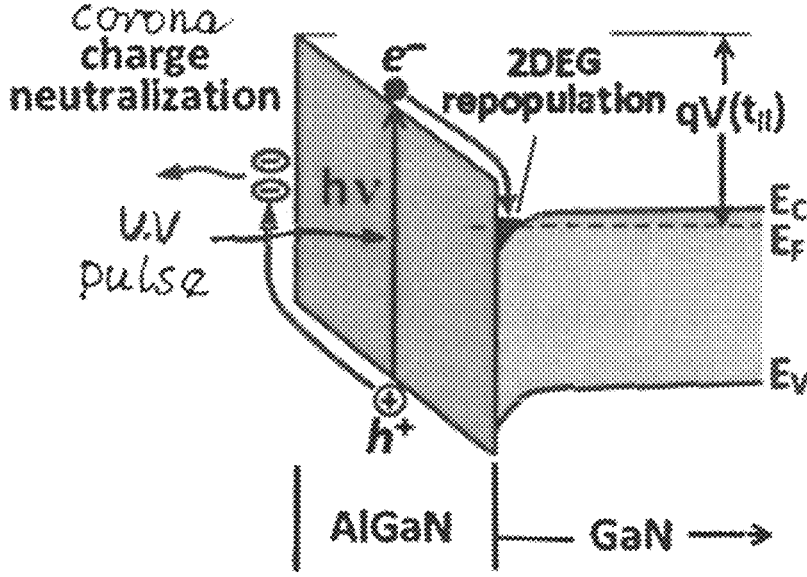
FIG. 11 is a AlGaN/GaN bandgap diagram illustrating a UV radiation induced charge neutralization effect causing repopulation of the 2DEG (two dimensional electron gas)

The characterization of AlGaN/GaN structures for high electron mobility transistors takes advantage of the linear corona charge neutralization induced by UV radiation pulses that generate electron-hole pairs within AlGaN barrier layer of the structure. As the first step in the characterization process, a large negative corona charge is deposited at a region on the top surface of the structure, typically an AlGaN barrier layer. The charge depopulates the two-dimensional electron gas, 2DEG, at AlGaN/GaN interface. Further characterization sequence comprises irradiating the region with a series of ultraviolet (UV) radiation pulses neutralizing the deposited charge in a series of incremental steps and causing repopulation of the 2DEG. As schematically shown in FIG. 11, measuring the surface voltage at the region before and after each UV pulse with duration, $\Delta t_p$, gives incremental changes of the surface voltage, $\Delta V$, corresponding to the pulse. Capacitance-voltage (C-V) characteristic is calculated for the region based on a series of $\Delta t_p/\Delta V$ values and surface voltage values, V.

AlGaN/GaN characterization can be based on relative capacitance values $C_{rel} = \Delta t_p/\Delta V$ or on the calibrated values $C = f_{cal} \cdot C_{rel}$. The latter gives the capacitance in absolute units.

Figure 12:
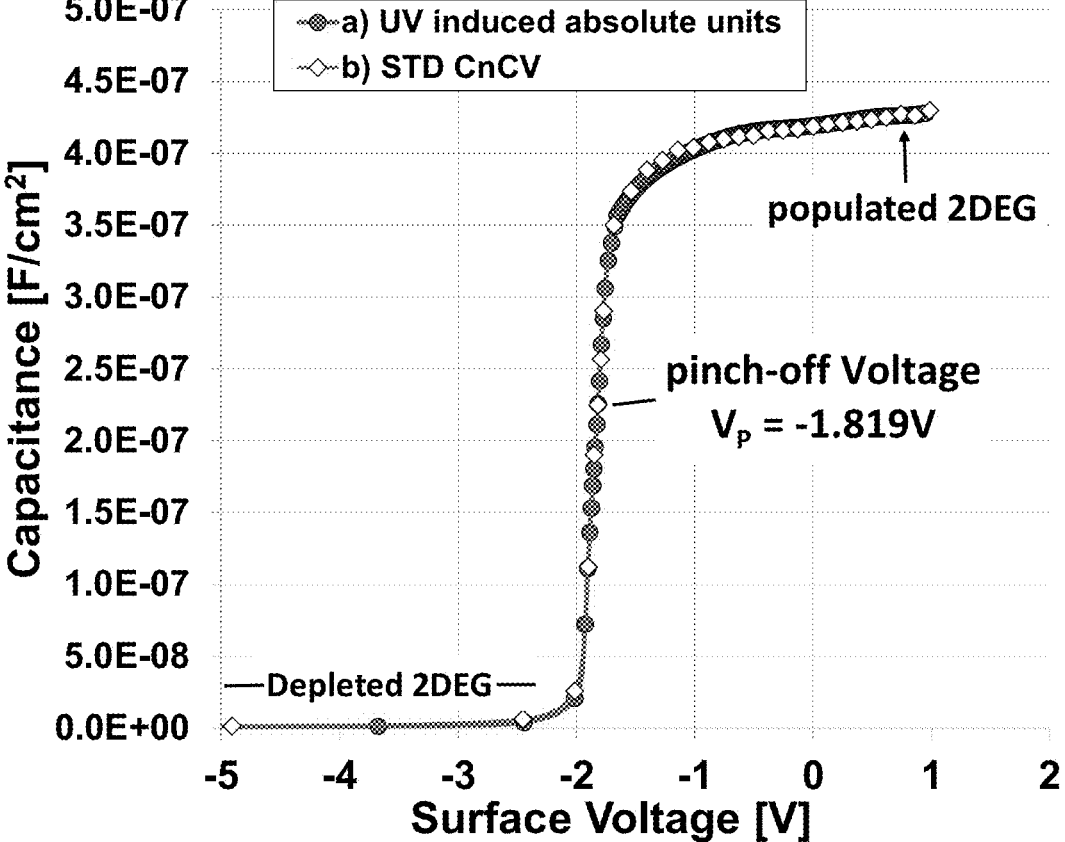
FIG. 12 is a plot showing a C-V characteristic measured with UV radiation pulses according to the described method and calibration for absolute unit capacitance values. For comparison, a standard CnCV capacitance-voltage characteristic is shown measured with corona charging steps at the same wafer region as the UV based C-V.

An example of such a capacitance-voltage, C-V characteristic is shown in FIG. 12. The three AlGaN/GaN structure parameters, namely the pinch-off voltage, $V_p$; the AlGaN layer electrical thickness, $d_{AlGaN}$, and the 2DEG charge density, $Q_{2DEG}$, can be determined from the calibrated absolute unit C-V characteristic using standard C-V metrology procedures described in literature. The most important parameter is the pinch-off voltage. It is determined as the surface voltage value corresponding to the half capacitance value in C-V step as indicated in FIG. 12. Accordingly, the $V_p$ can also be determined according to the present method using the relative unit $C_{rel}$–V characteristic without calibration. Such direct $V_p$ determination can be beneficial for enhanced throughput measurements and uniformity testing on AlGaN/GaN wafers.

It is a general feature of methods in the present disclosure that they enable determination of semiconductor parameters in relative units without calibration. Such relative values can be of practical importance for wafer level testing of the within wafer uniformity. Whenever needed, the relative unit values can be converted to absolute units using a calibration constant $f_{cal}$ measured at one wafer region and applied to all other regions.

What is claimed is:

1. A method of characterizing a wide-bandgap semiconductor sample, the method comprising:

depositing a corona charge on a surface of the semiconductor sample in the dark to bias a region of the semiconductor sample to depletion;

measuring a surface voltage at the region in the dark after depositing the corona charge;

irradiating the region with a series of ultraviolet (UV) radiation pulses to neutralize the deposited corona charge in a series of incremental steps, each comprising a UV radiation wavelength, $\lambda$, a photon flux, $\Phi$, and a pulse duration, $\Delta t_p$ corresponding to a linear corona charge neutralization range, wherein the increments of neutralized corona charge, $\Delta Q$, are linear with the pulse duration, $\Delta t_p$;

measuring the surface voltage at the region in the dark before and after each UV radiation pulse and determining an average voltage in the UV radiation pulse, and an incremental change of the surface voltage, $\Delta V$, corresponding to the UV radiation pulse;

calculating a capacitance-voltage (C-V) characteristic for the region based on a series of capacitance values and surface voltage (V) values, the capacitance (C) values being determined for each UV radiation pulse based on a ratio $$\frac{\Delta t_p}{\Delta V}$$

for the corresponding UV radiation pulse and a calibration constant $f_{cal}$ relating a neutralized charge increment $\Delta Q$ to the pulse duration for specific UV radiation photon flux, $\Phi$, as $\Delta Q = f_{cal} \cdot \Delta t_p$; and determining one or more electrical parameters for the semiconductor sample at the region based on the capacitance-voltage (C-V) characteristic.

2. The method of claim 1, wherein calculating the capacitance-voltage (C-V) characteristic comprises determining a capacitance (C) value for each UV radiation pulse according to a relationship:

$$C = f_{cal} \cdot \Delta t_p / \Delta V.$$

3. The method of claim 1, wherein the calibration constant $f_{cal}$ is equal to 1 and the capacitance (C) values are determined in relative units as $C_{rel} = \Delta t_p / \Delta V$ and values of the one or more electrical parameters are determined in relative units.

4. The method of claim 3, wherein the values of the one or more electrical parameters in relative units are determined at multiple regions on the semiconductor sample.

5. The method of claim 4, wherein the values of the one or more electrical parameters are determined at nine, 12, or 49 regions of the semiconductor sample.

6. The method of claim 2, wherein the calibration constant $f_{cal}$ is experimentally determined for the specific UV radiation photon flux, $\Phi$, and the calibration constant $f_{cal}$ determination comprises using a reference calibration corona charge using a known reference arbitrary unit capacitance or a reference known doping concentration.

7. The method of claim 1, wherein the semiconductor sample is a wafer comprising a SiC, GaN, AlGaN, or AlGaN/GaN HEMT structure.

8. The method of claim 1, wherein the UV radiation length $\lambda$, is 240 nm or less.

9. The method of claim 1, wherein the photon flux, $\Phi$, is in a range from $5 \times 10^{12}$ to $10^{14}$ photons per $cm^2$.

10. The method of claim 1, wherein the pulse duration, $\Delta t_p$, is in a range from 0.5 milliseconds to 10 milliseconds.

11. The method of claim 1, wherein the semiconductor sample comprises an AlGaN/GaN HEMT structure and the one or more electrical parameters comprises a pinch-off voltage of the AlGaN/GaN HEMT structure determined based on an arbitrary unit $C_{rel}$.

12. A system for acquiring capacitance-voltage characteristics according to the method of claim 1, comprising: a corona charge source; a noncontact surface voltage measurement probe; a pulsed UV radiation source; a UV detector arranged to monitor a photon flux from the pulsed UV radiation source; a moveable chuck configured to support the semiconductor sample relative to the corona charge source, the noncontact surface voltage measurement probe, and the pulsed UV radiation source; and a computer controller in communication with the corona charge source, the noncontact surface voltage measurement probe, and the pulsed UV radiation source and programmed to cause the system to perform measurements acquiring data of surface voltage increments and average voltage V values in a sequence of UV radiation pulses and to calculate capacitance-voltage (C-V) characteristics and to determine electrical parameters of the semiconductor sample.

13. A system for characterizing semiconductor doping in a wide bandgap semiconductor sample, the system comprising:

a surface voltage measurement probe;

a corona charge source;

a UV radiation source;

a moveable wafer chuck configured to support the semiconductor sample relative to the surface voltage measurement probe, the corona charge source, and the UV radiation source; and a computer controller in communication with the surface voltage measurement probe, the corona charge source, the UV radiation source, and the moveable wafer chuck, the computer controller being programmed to cause the system to:

(i) deposit, using the corona charge source, a corona charge on a surface of the semiconductor sample in the dark to bias a region of the semiconductor sample to depletion;

(ii) measure, using the surface voltage measurement probe, a surface voltage at the region in the dark after depositing the corona charge;

(iii) irradiate, using the UV radiation source, the region with a series of ultraviolet (UV) radiation pulses to neutralize the deposited corona charge in a series of incremental steps, each comprising a short UV radiation wavelength, $\lambda$, a photon flux, $\Phi$, and a pulse duration, $\Delta t_p$ corresponding to a linear corona charge neutralization range, wherein increments of neutralized corona charge, $\Delta Q$, are linear with the pulse duration, $\Delta t_p$;

(iv) measure, using the surface voltage measurement probe, the surface voltage at the region in the dark before and after each UV radiation pulse and determining an average voltage in the UV radiation pulse, and an incremental change of the surface voltage, $\Delta V$, corresponding to the UV radiation pulse;

(v) calculate a capacitance-voltage (C-V) characteristic for the region based on a series of capacitance (C) values and surface voltage (V) values, the capacitance (C) values being determined for each UV radiation pulse based on a ratio $$\frac{\Delta t_p}{\Delta V}$$

for the corresponding UV radiation pulse and a calibration constant $f_{cal}$ relating a neutralized charge increment $\Delta Q$ to the pulse duration for specific UV radiation photon flux, $\Phi$, as $\Delta Q = f_{cal} \cdot \Delta t_p$; and (vi) determine one or more electrical parameters for the semiconductor sample at the region based on the capacitance-voltage (C-V) characteristic.

14. The system of claim 13, wherein the UV radiation source is arranged to irradiate the region at a position different from the position under the surface voltage measurement probe.

15. The system of claim 14, further comprising a moving stage supporting the moveable wafer chuck and the computer controller is programmed to cause the stage to move the region between the surface voltage measurement probe and the UV radiation source.

16. The system of claim 13, wherein the UV radiation source is arranged to illuminate the region while the region is positioned under the surface voltage measurement probe.

17. The system of claim 16, wherein the computer controller is programmed to cause the system to irradiate the region while simultaneously monitoring neutralization induced surface voltage decay at the region.

18. The system of claim 16, wherein the surface voltage measurement probe comprises a nontransparent electrode and the UV radiation source is arranged to direct radiation at a non-normal angle to the surface of the semiconductor sample at the region.

19. The system of claim 13, wherein the surface voltage measurement probe is a non-contact Kelvin probe.

20. The system of claim 13, wherein the UV radiation source is configured to provide a photon flux in a range from $5 \times 10^{12}$ to $10^{14}$ photons per $cm^2$.

21. The system of claim 13, wherein the UV radiation source is configured to emit radiation at a wavelength of 240 nm or less.

* * * * *